US 8,542,342 B2

(12) United States Patent
Schwab et al.

(10) Patent No.: US 8,542,342 B2
(45) Date of Patent: *Sep. 24, 2013

(54) METHOD OF MANUFACTURING A MINIATURIZED DEVICE

(75) Inventors: Markus Schwab, Herzogenaurach (DE); Aksel Goehnermeier, Aalen (DE); Toralf Gruner, Aalen-Hofen (DE); Tammo Uitterdijk, GJ de Bilt (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 650 days.

This patent is subject to a terminal disclaimer.

(21) Appl. No.: 12/408,577

(22) Filed: Mar. 20, 2009

(65) Prior Publication Data

US 2009/0190116 A1    Jul. 30, 2009

Related U.S. Application Data

(63) Continuation of application No. 11/294,860, filed on Dec. 5, 2005, now Pat. No. 7,508,489.

(60) Provisional application No. 60/634,993, filed on Dec. 13, 2004.

(51) Int. Cl.
  *G03B 27/42*   (2006.01)
  *G03B 27/54*   (2006.01)
  *G03B 27/32*   (2006.01)

(52) U.S. Cl.
  USPC ................................ 355/53; 355/67; 355/77

(58) Field of Classification Search
  USPC ............. 355/52, 53, 55, 67–71, 77; 250/548; 356/399–401
  See application file for complete search history.

(56) References Cited

U.S. PATENT DOCUMENTS

| | | | |
|---|---|---|---|
| 5,499,100 A | | 3/1996 | Tanaka |
| 5,710,620 A | * | 1/1998 | Taniguchi ........................ 355/53 |
| 5,739,899 A | | 4/1998 | Nishi et al. |
| 5,867,319 A | | 2/1999 | Sugiyama et al. |
| 5,926,257 A | | 7/1999 | Mizouchi |
| 6,078,380 A | * | 6/2000 | Taniguchi et al. .............. 355/52 |
| 6,285,443 B1 | | 9/2001 | Wangler et al. |
| 6,333,777 B1 | | 12/2001 | Sato |
| 6,522,387 B2 | | 2/2003 | Mulkens |

(Continued)

FOREIGN PATENT DOCUMENTS

| | | |
|---|---|---|
| WO | WO 03/075049 | 9/2003 |
| WO | WO 03/077036 | 9/2003 |
| WO | WO 03/077037 | 9/2003 |

*Primary Examiner* — Hung Henry Nguyen
(74) *Attorney, Agent, or Firm* — Fish & Richardson P.C.

(57) ABSTRACT

A lithographic method of manufacturing a miniaturized device using a projection exposure system involves illuminating the object plane of an imaging optics of the projection exposure system with measuring light; detecting, for each of a plurality of locations on an image plane of the imaging optics, an angular distribution of an intensity of the measuring light traversing the image plane at the respective location; adjusting a telecentricity of the projection exposure system based on a selected patterning structure to be imaged and on the plurality of the detected angular distributions; disposing the selected pattern structure to be imaged in a region of the object plane of the imaging optics; disposing a substrate carrying a resist in a region of the image plane of the imaging optics and exposing the resist with imaging light using the projection exposure system with the adjusted telecentricity; and developing the exposed resist and processing the substrate with the developed resist.

22 Claims, 5 Drawing Sheets

(56) References Cited

U.S. PATENT DOCUMENTS

| | | |
|---|---|---|
| 6,833,904 B1 * | 12/2004 | Komatsuda .................... 355/67 |
| 6,891,596 B2 | 5/2005 | Rostalski et al. |
| 7,315,353 B2 | 1/2008 | Van De Kerkhof et al. |
| 7,372,539 B2 * | 5/2008 | Kirchner et al. ................ 355/52 |
| 7,508,489 B2 * | 3/2009 | Schwab et al. ................. 355/53 |
| 2003/0007253 A1 | 1/2003 | Schuster et al. |
| 2005/0141098 A1 | 6/2005 | Schuster |

* cited by examiner

METHOD OF MANUFACTURING A MINIATURIZED DEVICE

CROSS-REFERENCES TO RELATED APPLICATIONS

The present application is a continuation of U.S. patent application Ser. No. 11/294,860, filed on Dec. 5, 2005, now U.S. Pat. No. 7,508,489, which claims benefit under 35 U.S.C. §119(e) of U.S. Provisional Patent Application No. 60/634,993, filed on Dec. 13, 2004, now abandoned, the disclosures of which are hereby incorporated by reference in their entirety for all purposes.

BACKGROUND OF THE INVENTION

The present invention relates to a method of manufacturing miniaturized devices.

Lithographic processes are commonly used in the manufacture of miniaturized structures such as integrated circuits, liquid crystal elements, micro-patterned structures and micro-mechanical components.

A projection exposure apparatus used for photolithography generally comprises a projection optical system for imaging a patterning structure, commonly referred to as a reticle, onto a substrate, commonly referred to as a wafer. The substrate (wafer) is coated with a photo-sensitive layer, commonly referred to as a resist, which is exposed with the image of the patterning structure using imaging light. The imaging light is generated by an illumination optical system illuminating the patterning structure.

The trend to produce even smaller and more sophisticated miniaturized devices places increasingly high demands on the projection exposure system. Such demands include a high quality of the imaging of the patterning structure onto the wafer. In particular, imaging characteristics, such as imaging aberrations, such as a coma, field curvature and others, should be low. One further imaging characteristics is a telecentricity of the imaging. A preferred imaging optics is a telecentric optics which means that main rays or chief rays of imaging light passing through an image plane of the imaging optics are parallel to an optical axis of the imaging optics. In such situation, positions of patterns imaged on the substrate will substantially not depend on a position of the substrate along the optical axis within the depth of focus of the system. Therefore, it is desired to adjust a telecentricity of the projection exposure system such that the imaging of the pattern onto the substrate is a telecentric imaging.

From U.S. Pat. No. 5,499,100 and U.S. Pat. No. 5,739,899 there are known projection optical systems allowing to determine a telecentric property of the imaging optics and to adjust characteristics of the projection exposure system such that a telecentric property of the imaging is improved.

It has been found that the conventional methods using a projection exposure system allowing detection and adjustment of telecentric properties still provides an insufficient quality of the imaged patterns.

SUMMARY OF THE INVENTION

In view of the above, it is an object of the present invention to provide a method of manufacturing a miniaturized device using a projection exposure system wherein a telecentricity of the projection exposure system may be adjusted such that an imaging quality of the system is improved.

According to an exemplary embodiment, there is provided a method of manufacturing a miniaturized device using a projection exposure system, the method comprising: illuminating the object plane of an imaging optics of the projection exposure system with measuring light; detecting, for each of a plurality of locations on an image plane of the imaging optics, an angular distribution of an intensity of the measuring light traversing the image plane at the respective location; adjusting a telecentricity of the projection exposure system based on a selected patterning structure to be imaged and on the plurality of the detected angular distributions; disposing the selected pattern structure to be imaged in a region of the object plane of the imaging optics; and disposing a substrate carrying a resist in a region of the image plane of the imaging optics and exposing the resist with imaging light using the projection exposure system with the adjusted telecentricity.

The inventors have found that a particular adjustment of the telecentricity of the projection exposure system has different effects on a telecentricity of the imaging performed for different patterning structures. This means that, for a given adjustment of the telecentricity of the projection exposure system, a first selected patterning structure will be imaged with a high telecentricity and, thus, a high optical quality, while a second selected patterning structure will be imaged with a comparatively lower imaging quality due to a remaining telecentric error.

Therefore, the telecentric properties of the imaging optics are determined by detecting the angular distributions of the intensity of the measuring light traversing the image plane at a plurality of locations. The detected angular distributions of the intensity, or corresponding data sets derived from the angular distributions, represent the determined telecentric properties of the imaging optics. The adjustment of the telecentricity of the projection exposure system is then performed not only in dependence of the measured telecentric properties of the imaging optics but also in dependence of a selected patterning structure which is actually to be imaged onto the substrate. The adjustment of the telecentricity of the projection exposure system in dependence of the selected patterning structure has the advantage that an angular distribution of the imaging light used for imaging the respective patterning structure onto the substrate is taken into account when adjusting the telecentric properties of the projection exposure system. For instance, two different patterning structures will be imaged onto the substrate with imaging light having different angular distributions. This means that the imaging light for imaging a first patterning structure and having a first angular distribution will experience optical properties of the imaging optics which are different from the optical properties experienced by imaging light used for imaging a second patterning structure and having a second angular distribution.

According to one aspect, the adjustment of the telecentricity of the projection exposure system for imaging the first patterning structure may be different from an adjustment of the telecentricity of the projection exposure system for imaging the second patterning structure in view of improving the telecentric property of the imaging for both the first and the second pattering structures.

According to an exemplary embodiment of the invention, the detecting of the plurality of the angular distributions comprises detecting a spatial distribution of the intensity of the measuring light incident on a position-sensitive detector. According to a particular embodiment herein, the position-sensitive detector comprises a plurality of detector elements or pixels. According to a further particular embodiment herein, the measuring light is supplied to the detector through a measuring optics disposed downstream of the image plane of the imaging optics, wherein the position-sensitive detector is disposed in a plane which is, relative to the measuring optics, a Fourier plane relative to the image plane of the imaging optics. Thus, the angular distribution of the measuring light at a position of the image plane of the imaging optics is detected as a spatial distribution of the intensity of the measuring light in the Fourier plane of the imaging optics.

According to an exemplary embodiment of the invention, the angular distributions are subsequently detected for the different locations of the image plane. In particular, measuring light traversing the image plane outside of the location selected for determining the angular distribution is intercepted by a beam stop.

According to an exemplary embodiment, the beam stop is disposed in the image plane of the imaging optics, and according to an alternative embodiment, the beam stop is disposed in the object plane of the imaging optics.

According to a further exemplary embodiment, the detecting of the plurality of angular distributions comprises intercepting the measuring light traversing the image plane outside of the location selected for detecting the angular distribution, and the detecting further comprises detecting of a spatial distribution of the intensity of the measuring light traversing the selected location downstream of the image plane, or detecting an angular distribution of the intensity of the measuring light traversing the selected location downstream of the image plane.

According to an exemplary embodiment herein, the intercepting of the measuring light is achieved by a beam stop disposed in the image plane or in the object plane of the imaging optics.

The adjusting of the telecentricity of the projection exposure system may comprise any suitable adjustment of parameters of the projection exposure system. One example of such parameter is a position of a first component of the projection exposure system relative to a second component of the projection exposure system. According to exemplary embodiments of the invention, the adjusting of the telecentricity comprises displacing an aperture stop of the imaging optics relative to an optical axis of the imaging optics, adjusting a position of the substrate relative to the imaging optics, adjusting a position of the patterning structure relative to the imaging optics, adjusting positions of components of an illumination optical system for generating the imaging light relative to each other, adjusting positions of components of the imaging optics relative to each other, and others.

The determination of the telecentric properties of the imaging optics may be performed at a site of a manufacturer of the imaging optics. The telecentric properties determined by the manufacturer may be represented as a set of parameters, such as a table or a data file, and may be used by a costumer using the imaging optics in a lithographic method of manufacturing miniaturized devices. The customer selects the patterning structure which is to be used in a particular lithographic step, determines a setting of adjustable parameters of the projection exposure system based on the selected patterning structure to be used for the imaging and based on the representation of the telecentric properties of the imaging optics such that the imaging of that selected patterning structure is substantially telecentric at a side of the substrate. The projection exposure system is then adjusted to conform with the determined setting, and plural dies on plural wafers are exposed with the imaging patterning structure while the adjustment of the telecentricity of the projection exposure system is maintained unchanged. Thereafter, a next patterning structure may be selected for imaging, and new settings of the adjustable parameters are determined in dependence of the new selected patterning structure and the telecentric properties of the imaging optics. Plural dies and wafers are processed with the projection exposure system having its telecentricity adjusted accordingly.

From time to time the user may perform a new determination of the telecentric properties of the imaging optics to be able to take possible drifts of properties of the imaging optics into account. The new determined telecentric properties will then be used for determining a next adjustment of the telecentricity of the projection exposure system.

According to another exemplary embodiment, there is provided a projection exposure system comprising an imaging optics for imaging a patterning structure disposed in a region of an object plane of the imaging optics onto a substrate disposed in a region of an image plane of the imaging optics; a first mount for mounting the patterning structure in the region of the object plane; a second mount for mounting the substrate in the region of the image plane; an illuminating optics for illuminating the object plane with at least one of exposure light and measuring light; at least one actuator for displacing an optical element of at least one of the imaging optics and the illuminating optics; a detecting system configured to detect, for each of a plurality of locations on the image plane of the imaging optics, an angular distribution of an intensity of measuring light traversing the image plane at the respective location; and a controller configured to drive the at least one actuator based on a selected patterning structure to be imaged and on the plurality of the detected angular distributions.

BRIEF DESCRIPTION OF THE DRAWINGS

In the following, exemplary embodiments of the present invention are explained in further details with reference to the figures, wherein.

DETAILED DESCRIPTION OF SPECIFIC EMBODIMENTS

In the exemplary embodiments described below, components that are similar in function and structure are designated as far as possible by similar reference numerals. Therefore, to understand the features of the individual components of a specific embodiment, the descriptions of other embodiments and of the summary of the invention should be referred to.

Figure 1:
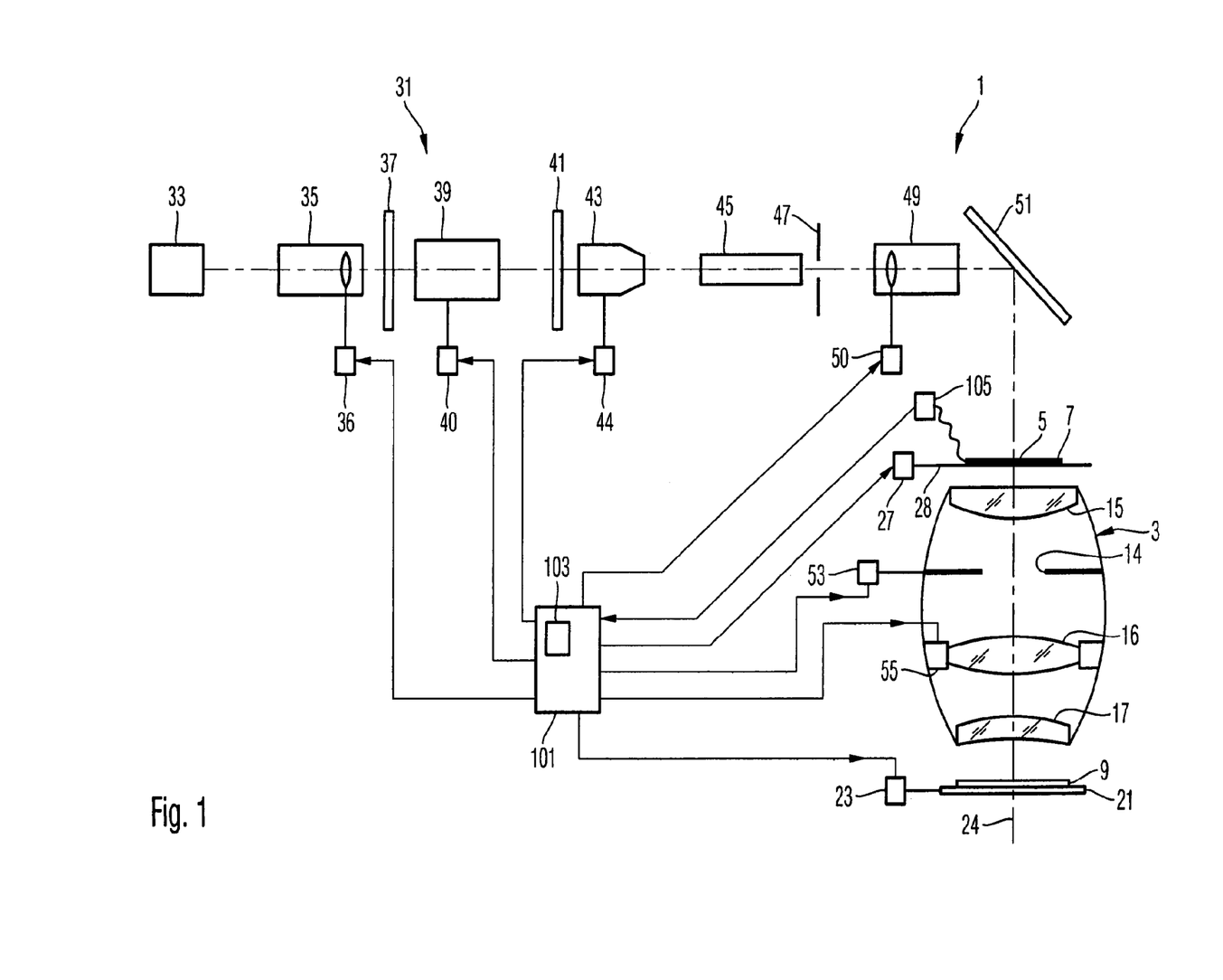
FIG. 1 is a schematic representation of a projection exposure system which may be used in an exemplary embodiment of a lithographic method according to the present invention.

FIG. 1 schematically illustrates a projection exposure system 1. The projection exposure system 1 comprises a projection optical system 3 for imaging a patterning structure 5 provided on a reticle 7 onto a wafer 9. The patterning structure 5 is disposed in an object plane of the projection optical system 3, and a surface of the wafer 9 is disposed in an image plane of the projection optical system 3.

FIG. 1 shows a very schematic representation of the projection optical system 3 by indicating only three lenses 15, 16 and 17 and an aperture stop 14. The projection optical system 3 may be of a liquid-immersion type wherein an immersion liquid is disposed in a space between the surface of the wafer 9 and front lens 17 of the projection optical system 3. Details of an example of the liquid immersion-type projection optical system are disclosed in the WO 2003/077037 A1, which document is incorporated herein by reference. However, the invention is not limited to liquid immersion-type projection optical systems. Examples of other types of projection optical systems are known from US 2003/0007253 A1, WO 2003/075049 A2 and WO 2003/077036 A1, which documents are incorporated herein by reference.

The wafer is covered with a resist-layer which is developed after exposure with the image of the patterning structure 5. The wafer 9 is mounted on a wafer stage 21. An actuator 23 is provided for positioning the wafer 9 relative to the projection optical system 3. In particular, the actuator 23 comprises an actuator for changing a focal state of the imaging by changing a distance of the wafer 9 from the front lens 17 in a direction along an optical axis 24 of the projection optical system 3, and actuators for translating the wafer 9 in directions transverse to the optical axis 24 for changing the field of exposure on the wafer. For example, the exposure of the wafer 9 may be performed according to a conventional stepping or scanning process.

The actuator 23 may further comprise an actuator for changing a tilt of the wafer 9 relative to the optical axis 24.

Similarly, the reticle 7 is mounted on a reticle stage 28 having actuators 27 associated therewith for positioning the reticle 7 relative to the imaging optics 3.

The exposure of the wafer 9 is performed with imaging light generated by an illumination optical system 31 comprising an imaging light source 33, such as an excimer laser, for example, a KrF excimer laser emitting light of a wavelength of 248 nanometers. A beam of imaging light generated by light source 33 traverses a beam expander 35, a first diffractive optical element (DOE) 37, an objective lens arrangement 39, a second diffractive optical element 41, an optical lens arrangement 43, a glass rod 45, a reticle mask 47, and an optical lens arrangement 49, to be reflected from a mirror 51 for illuminating the patterning structure 5 with imaging light. The illumination optical system 31 illustrated so far is of a conventional type as it is known from U.S. Pat. No. 6,285,443 B1, the disclosure of which is incorporated herein by reference. The illumination optical system is, however, not limited to that type and may be of any other type, such as those known from U.S. Pat. No. 5,926,257 and U.S. Pat. No. 5,710,620, the contents of which are incorporated herein by reference.

The projection exposure system 1 schematically illustrated in FIG. 1 comprises a plurality of actuators for adjusting optical properties of the imaging of the patterning structure 5 onto the wafer 9. One of such optical properties is a telecentric property of the imaging, and FIG. 1 illustrates a plurality of actuators which may be effective for adjusting the telecentric properties of the imaging. Exemplary actuators for adjusting the telecentric properties comprise an actuator 36 for displacing a lens or plate relative to other lenses of the beam expander 35, actuators 40 and 44 for adjusting positions of objective lenses 39 and 43, respectively, relative to a main axis of the illumination optical system 31 and relative to each other, an actuator 50 for positioning a lens of objective lens arrangement 49 relative to other lenses thereof, the actuator 27 for adjusting a tilt of the reticle 7 relative to the optical axis 24, an actuator 53 for displacing the aperture stop 14 transversely to the optical axis 24, an actuator 55 for adjusting a position of lens 16 relative to other lenses 15, 17 of the imaging optics 3, and the actuator 23 for adjusting a tilt of the wafer relative to the optical axis 24.

A controller 101 is provided for controlling the actuators 36, 40, 44, 50, 27, 53, 55 and 23 and other components of the projection exposure system.

The above illustrated method of adjusting telecentric properties of the imaging by using actuators 36, 40, 44, 50, 27, 53, 55 and 23 is merely illustrative for illustrating the principles of the present invention. Any other suitable means may be used for adjusting the telecentric properties of the imaging. Other examples of such methods are disclosed in U.S. Pat. No. 6,522,387 B2, U.S. Pat. No. 5,867,319, U.S. Pat. No. 5,739,899, U.S. Pat. No. 5,499,100, the contents of which are incorporated herein by reference.

Figure 2:
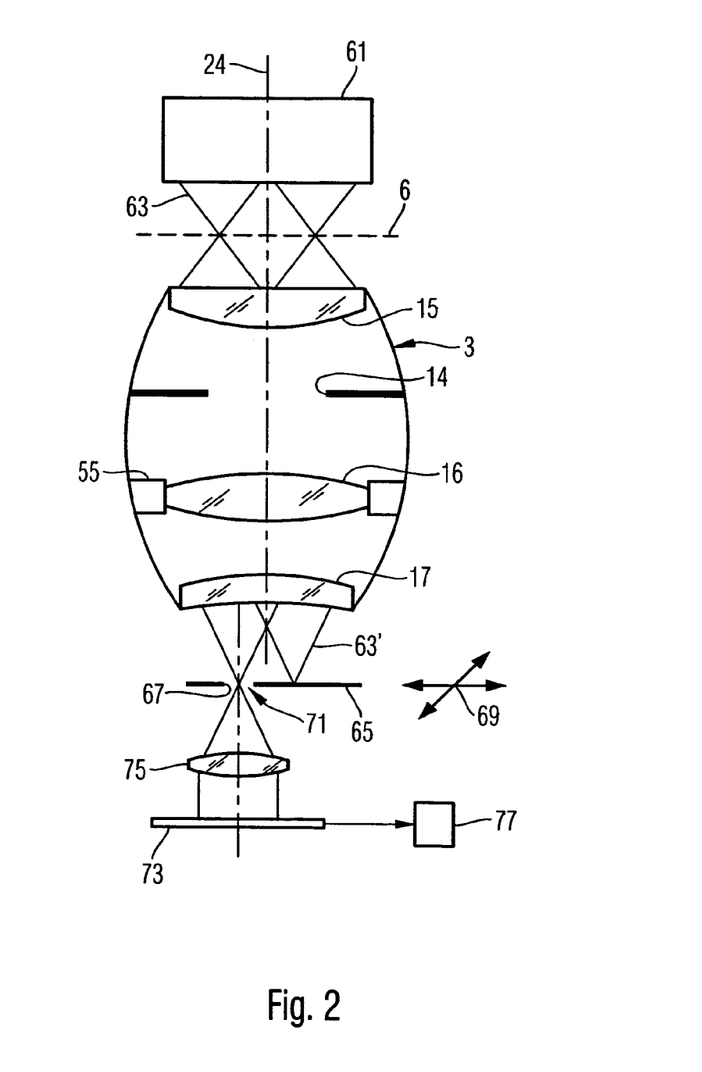
FIG. 2 is a schematic representation of an arrangement for determining telecentric properties of an imaging optics shown in FIG. 1.

FIG. 2 illustrates an arrangement for measuring telecentric properties of the imaging optics 3. The arrangement comprises a source 61 of measuring light illuminating the object plane 6 of the imaging optics with measuring light 63 such that measuring light traversing the object plane 6 is supplied to the imaging optics 3 through front lens 15 thereof. The measuring light source 61 generates the measuring light 63 such that a maximum possible field in the object plane 6 which is accepted by the imaging optics 3 is illuminated with a maximum numerical aperture which is accepted by the imaging optics 3 for imaging patterning structures onto the wafers. Further, the measuring light source 61 generates the measuring light 63 such that an intensity thereof has a substantially constant distribution across the illuminated field in the object plane 6 and for all angles within the numerical aperture used by the light 63.

A beam stop 65 formed as a plate having a small through-hole or aperture 67 is disposed in the image plane of the imaging optics 3. The beam stop 65 is displaceable in a plane transversely oriented relative to the optical axis 24 of the imaging optics 3, as indicated by arrows 69. The beam stop 65 may be displaced such that the aperture 67 may be positioned at each location 71 within the field of the image plane which is illuminated with the measuring light 63. Thus, a major portion of the measuring light, such as the beams indicated by reference numeral 63' in FIG. 2, will be intercepted by the beam stop 65, and only a small portion of the measuring light 63, such as the light beams indicated by reference numeral 63'' in FIG. 2, will traverse the beam stop 65 through aperture 67 which is positioned at a selectable location 71 within the image plane. Beam 63'' traversing the object plane at the selected location 71 is imaged onto a two-dimensionally position-sensitive detector 73 through a microscope objective lens arrangement 75 represented by only one single exemplary lens in FIG. 2. The microscope objective lens arrangement 75 is positioned such that an object plane of the microscope 75 coincides with the image plane of the imaging optics 3. The detector 73 is positioned such that a plane where the light-sensitive pixels of the detector are disposed substantially coincides with a Fourier plane of the object plane of the microscope 75. Thus, a spatial distribution of the light intensities detected by detector 73 represents the angular distribution of intensities of measuring light 63'' traversing the image plane of the imaging optics 3 at location 71. The detected distributions of light intensities are read out to a computer 77 for further processing and storage of data representing the telecentric properties of the imaging optics 3. In particular, detection of the intensity distribution by detector 73 is repeated for plural locations 71 within the image plane of the imaging optics 3, by repeatedly displacing the beam stop 65 and performing corresponding measurements with detector 73.

The detected intensity distributions are indicative of telecentric properties of the imaging optics 3.

Figure 4:
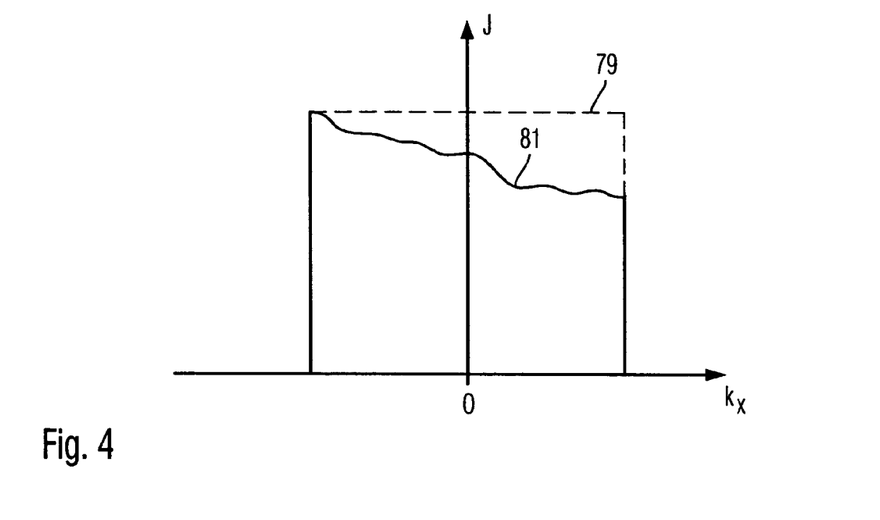
FIG. 4 is an illustrative representation of a possible telecentric property of the imaging optics shown in FIG. 1.

FIG. 4 shows an exemplary exaggerated representation of an angular distribution of light intensities detected at a particular location 71. J represents the detected intensity, $k_x$ represents the angle in the xz-plane, and broken line 79 represents an expected intensity distribution for an ideal imaging optics being perfectly telecentric. In practice, however, the imaging optics 3 is not perfectly telecentric, and line 81 represents an exemplary angular distribution of intensities measured downstream of the selected location 71 on the image plane of the imaging optics. In this example, intensities decrease from left to right, and, in particular, a total intensity of light in the left half space (negative values of $k_x$) is substantially higher than the light intensities in the right half space (positive values of $k_x$).

Figure 5:
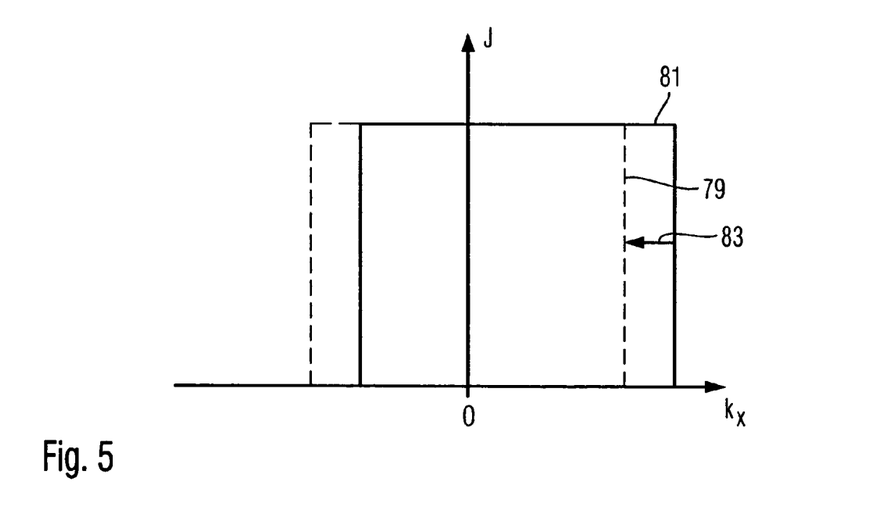
FIG. 5 is an illustrative representation of a further possible telecentric property of the imaging optics shown in FIG. 1.

FIG. 5 illustrates a further schematic exaggerated example of a possible detected angular distribution of measuring light 81, wherein broken line 79 again represents the ideal distribution of the perfectly telecentric imaging optics. In this example, the imaging optics does not change light intensities of one angle relative to other angles, but the whole transmitted light cone 63" is tilted relative to the optical axis.

The actuator 53 for displacing the aperture 14 of the imaging optics 3 relative to the optical axis 24 may be used for changing the telecentric properties of the imaging optics 3 such that the measured angular distribution 81 approaches the ideal distribution 79, as indicated by an arrow 83 in FIG. 5.

Figure 6:
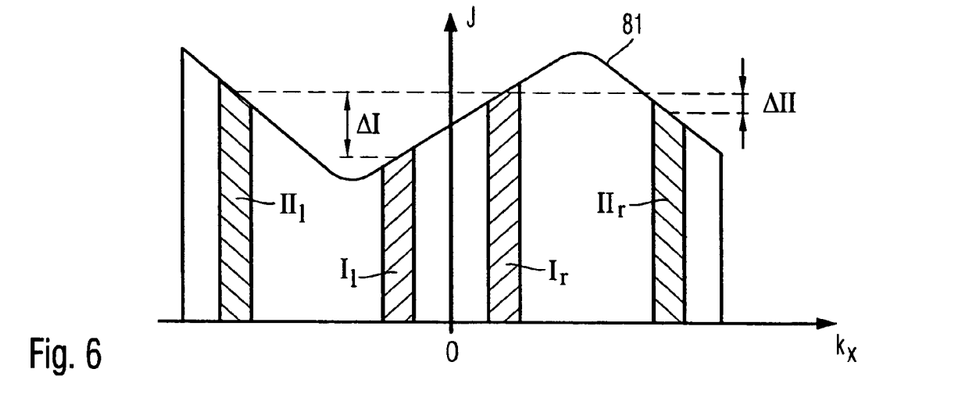
FIG. 6 is an illustration of a non-telecentricity in imaging two different patterning structures with the system shown in FIG. 1.

FIG. 6 is a further example of a schematic exaggerated measured intensity distribution 81 indicating a non-telecentric property of the imaging optics. Regions $I_l$, $I_r$, in FIG. 6 represent light mainly used for imaging a first patterning structure, and regions $II_l$, $II_r$ indicate light mainly used for imaging a second patterning structure. In this example, the first patterning structure is a low resolution patterning structure having structures which are arranged at a low spatial frequency, and the second patterning structure is a high resolution pattern having structures of a high spatial frequency. Since the measuring light is diffracted at the patterning structures, a corresponding angle of diffraction will be higher for the second patterning structure as compared to the first patterning structure. As a consequence, the imaging of the second patterning structure is effected with imaging light having higher angles relative to the optical axis of the imaging optics to achieve the necessary resolution, wherein the imaging of the first pattern will mainly use the imaging light of lower angles as indicated by regions $I_l$ and $I_r$ in FIG. 6.

It appears that the imaging of the first patterning structure is performed with a telecentric error such that the intensities in the right half space are higher than in the left half space. This is apparent from the difference $\Delta I$ between intensities $I_l$ and $I_r$ indicated in FIG. 6. However, the imaging of the second patterning structure is performed with a telecentric error such that the intensities in the left half space are higher than in the right half space as indicated by the difference $\Delta II$ between intensities $II_l$ and $II_r$. It appears that a compensation of a non-telecentricity of the imaging optics as represented by the distribution 81 in FIG. 6 may not be adequately performed for all possible imaging patterns.

Figure 7:
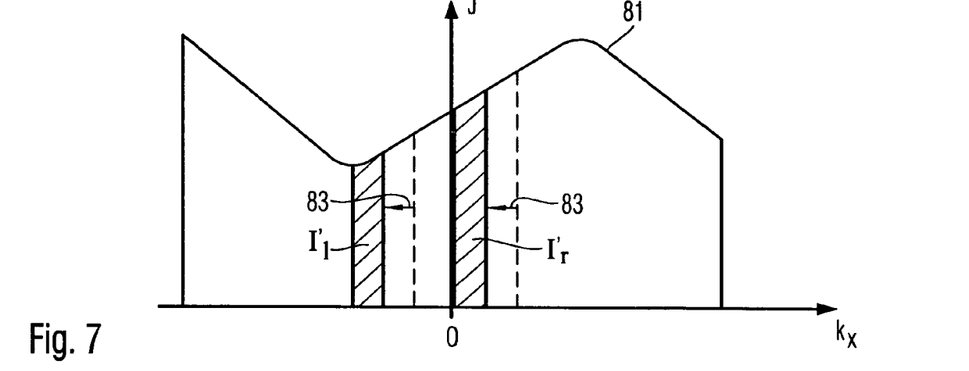
FIG. 7 illustrates an adjustment of a telecentricity of the projection exposure system shown in FIG. 1 for imaging a first pattern indicated in FIG. 6.

FIG. 7 illustrates a compensation of the non-telecentricity of the imaging optics for imaging the first patterning structure. One of the actuators illustrated above, such as actuator 53 for displacing the aperture 14, is operated in a direction as indicated by arrow 83 in FIG. 7 to increase the effective intensities $I_l'$ used for imaging the first pattern in the left half space. By increasing the negative angles of the light intensities indicated by $I_l'$ and reducing the positive angles of the light intensities indicated by $I_r'$ on the right, the left intensities $I_l'$ will gain more weight in the imaging as compared to the right intensities $I_r'$ such that finally the imaging of the first pattern is effected by substantially equal light intensities in the left and right half spaces.

Referring to FIG. 1, the controller 101 comprises a memory or storage portion 103 storing a table or data file including parameters and data indicative of the telecentric properties of the imaging optics 3.

The projection exposure system 1 further comprises a detector 105 for detecting an identifier of the reticle 7 disposed on the reticle stage 28. Such identifier may comprise a bar code which is detected by detector 105 using a scanning light beam or other suitable type of identifier, such as an electric or electronic code or other. The detection result of detector 105 is supplied to controller 101, and the controller performs the adjusting of actuators 36, 40, 44, 50, 27, 53, 55 and 23 based on the detection result of detector 105 and the parameters stored in the memory 103.

To determine an amount of adjustment of the telecentric properties of the projection exposure system, a calculation may be performed which includes a convolution of the angular intensities used for imaging the respective patterning structure and the measured angular distribution 81 of the measuring light intensity.

Figure 8:
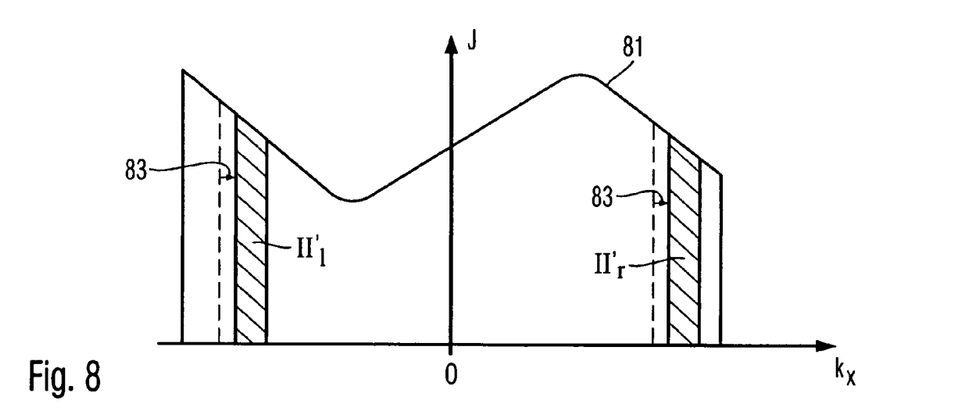
FIG. 8 illustrates an adjustment of a telecentricity of the projection exposure system shown in FIG. 1 for imaging a second pattern indicated in FIG. 6.

FIG. 8 illustrates an adjustment 83 of the telecentricity of the projection exposure system for reducing a telecentricity in the imaging of the second patterning structure. The light intensities are shifted in a positive direction such that a weight of the right portion $II_r'$ will be increased and a weight of the left portion of $II_l'$ of light used for imaging the second patterning structure is reduced to substantially equalize the light effecting the imaging for both half spaces.

After exposure of the resist covering the substrate or wafer with the image of the patterning structure, the substrate is further processed by lithographic steps such as post-exposure bake (PEB) of the resist, development of the resist, a hard bake and measurement and inspection of the imaged features. Further lithographic steps for processing the substrate may comprise etching, ion implantation, doping, metallization, oxidation, chemo-mechanical polishing and others, for forming layers of structured features of the miniaturized devices to be formed on a substrate. Thereafter, the devices are separated from one another by a technique such as dicing or sawing, and the individual devices may be mounted on a carrier connected to pins etc.

Figure 3:
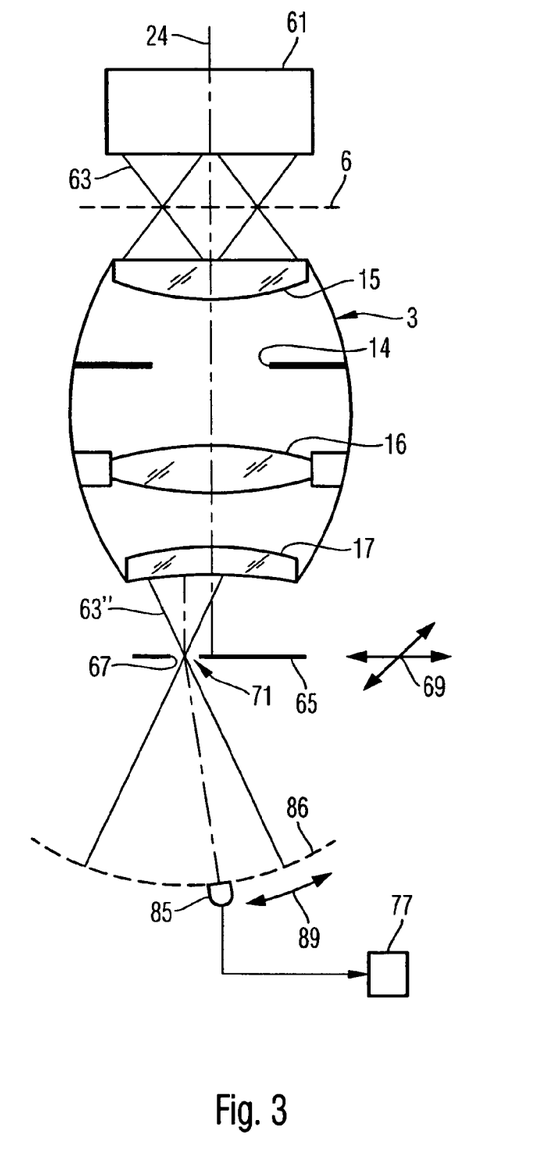
FIG. 3 is a schematic representation of a further arrangement which may be used for determining the telecentric properties of the imaging optics shown in FIG. 1.

FIG. 3 illustrates a further arrangement for measuring the telecentric properties of the imaging optics 3. The arrangement shown in FIG. 3 is similar to that illustrated with reference to FIG. 2 above. However, a light-sensitive detector 85 is disposed downstream of the aperture 67 in aperture plate 65 disposed at location 71 in the image plane of the imaging optics 3. The detector 85 is displaceable by a mechanism (not shown in FIG. 3) on a sphere 86 about aperture 67, as indicated by arrow 89. By reading the detected light intensities in dependence of the adjusted position of the detector 85 on the sphere, the computer 77 may directly determine the angular distribution of the intensities of measuring light 63" at location 71. Such process is repeated for plural locations 71 within the image plane of the imaging optics 3.

In the above illustrated embodiments, the light for imaging the pattern and the light for measuring the angular intensity distribution is generated by different optical systems (reference numeral 31 in FIG. 1 and reference numeral 61 in FIGS. 2 and 3). These embodiments are, however, only of an exemplary nature, and it is also possible to perform the measurement of the telecentric properties of the imaging optics by generating the measuring light with the same light source which also generates the light for imaging.

In the arrangements illustrated with reference to FIGS. 2 and 3, the aperture plate used for selecting the locations in the image plane is disposed in the image plane itself. Alternatively or in addition thereto, it is also possible to dispose a corresponding beam stop in the object plane of the imaging optics. If the imaging optics provides a magnification smaller than 1, i.e. a reduction, this may have an advantage of more relaxed requirements as to positioning of the beam stop and to fabrication of a miniaturized aperture therein.

While the invention has been described also with respect to certain specific embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A lithographic method comprising:
    adjusting a telecentricity of a projection exposure system based on a selected patterning structure to be imaged and based on telecentricity information obtained from an angular distribution of light intensity in an image plane of the projection exposure system;
    disposing the selected patterning structure to be imaged in a region of an object plane of the projection exposure system;
    disposing a substrate carrying a resist in a region of the image plane and exposing the resist with imaging light using the projection exposure system with the adjusted telecentricity; and
    developing the exposed resist and processing the substrate with the developed resist.

2. The method according to claim 1, further comprising:
    illuminating the object plane with measuring light;
    detecting, for each of a plurality of locations on the image plane, an angular distribution of an intensity of the measuring light traversing the image plane; and
    determining the telecentricity information based on the detected angular distributions of the intensity of the measuring light.

3. The method according to claim 2, wherein for each one of the plurality of locations, detecting the angular distributions of the intensity of the measuring light comprises supplying measuring light traversing the image plane at the one location to a position sensitive detector using a measuring optics, and detecting a spatial distribution of the intensity of the measuring light using the detector, wherein the detector is disposed in a plane which is, relative to the measuring optics, substantially a Fourier plane of the image plane.

4. The method according to claim 3, further comprising, for each one of the plurality of locations, intercepting the measuring light traversing the image plane outside of the one location using a beam stop.

5. The method according to claim 4, wherein the beam stop is disposed in the image plane.

6. The method according to claim 4, wherein the beam stop is disposed in the object plane.

7. The method according to claim 2, wherein detecting the plurality of angular distributions of the intensity of the measuring light comprises, for each one of the plurality of locations, intercepting measuring light traversing the image plane outside of the one location and detecting at least one of a spatial distribution of the intensity of the measuring light traversing the one location, and an angular distribution of the intensity of the measuring light traversing the one location.

8. The method according to claim 7, wherein the intercepting is achieved by disposing a beam stop in the image plane.

9. The method according to claim 7, wherein the intercepting is achieved by disposing a beam stop in the object plane.

10. The method according to claim 1, further comprising adjusting the telecentricity of the projection exposure system based on an angular distribution of light traversing the selected patterning structure.

11. The method according to claim 1, wherein adjusting the telecentricity of the projection exposure system comprises at least one of:
    displacing an aperture stop relative to an optical axis of the projection exposure system;
    adjusting a position of the substrate relative to the projection exposure system;
    adjusting a position of the selected patterning structure to be imaged relative to the projection exposure system; and
    adjusting a position of a first component of an illumination optical system generating the imaging light relative to a second component of the illumination optical system.

12. The method according to claim 1, further comprising exposing a plurality of dies on the substrate while the selected patterning structure is disposed in the region of the object plane and while the telecentricity of the projection exposure system is maintained constant.

13. The method according to claim 1, further comprising exposing a plurality of substrates while the selected patterning structure is disposed in the region of the object plane and while the telecentricity of the projection exposure system is maintained constant.

14. The method according to claim 2, further comprising disposing a plurality of different selected patterning structures in the region of the object plane, and for each one of the plurality of different selected patterning structures, adjusting the telecentricity of the projection exposure system based on the one selected patterning structure and based on a common detected angular distribution of the intensity of the measuring light.

15. The method according to claim 1, wherein the telecentricity information is determined at a manufacturing site of the projection exposure system.

16. The method according to claim 2, wherein the angular distributions of the intensity of the measuring light are detected at a manufacturing site of the projection exposure system.

17. The method according to claim 2, further comprising repeating the detection of the angular distributions of the intensity of the measuring light at a manufacturing site of the miniaturized device.

18. The method according to claim 1, further comprising:
    retrieving telecentricity information associated with the selected patterning structure to be imaged from a memory; and
    adjusting the telecentricity of the projection exposure system based upon the retrieved telecentricity information associated with the selected patterning structure.

19. The method according to claim 18, further comprising:
detecting an identifier that identifies the selected patterning structure; and
retrieving from the memory the telecentricity information associated with the selected patterning structure based on said identifier.

20. A projection exposure system comprising:
imaging optics for imaging a patterning structure disposed in a region of an object plane of the imaging optics onto a substrate disposed in a region of an image plane of the imaging optics;
an illuminating optics for illuminating the object plane with exposure light;
at least one actuator for displacing an optical element of the projection exposure system;
a memory configured to store telecentricity information for the imaging optics associated with multiple patterning structures; and
a controller configured to drive the at least one actuator to image a selected patterning structure based on stored telecentricity information associated with the selected patterning structure and based on telecentricity information obtained from an angular distribution of light intensity in the image plane.

21. The projection exposure system according to claim 20, wherein the projection exposure system comprises a detector for detecting an identifier associated with the selected patterning structure, and wherein the controller is further configured to retrieve the stored telecentricity information based on a detection signal of the detector.

22. The projection exposure system according to claim 20, wherein:
the illuminating optics are configured to illuminate the object plane with measuring light;
the projection exposure system further comprises a detecting system configured to detect, for each one of a plurality of locations on in the image plane, an angular distribution of an intensity of measuring light traversing the image plane at the one location; and
the controller is further configured to obtain telecentricity information from the detected angular distributions of the intensity of the measuring light and to store the telecentricity information in the memory.

* * * * *

UNITED STATES PATENT AND TRADEMARK OFFICE
CERTIFICATE OF CORRECTION

PATENT NO. : 8,542,342 B2  
APPLICATION NO. : 12/408577  
DATED : September 24, 2013  
INVENTOR(S) : Markus Schwab et al.

Page 1 of 1

It is certified that error appears in the above-identified patent and that said Letters Patent is hereby corrected as shown below:

In the Claims

Column 9, Line 54-55, Claim 3, delete "distributions" insert --distribution--;

Column 12, Line 15, Claim 22, delete "on in" insert --in--.

Signed and Sealed this
Seventeenth Day of December, 2013

Margaret A. Focarino
*Commissioner for Patents of the United States Patent and Trademark Office*